(12) United States Patent
Yun et al.

(10) Patent No.: US 8,173,480 B2
(45) Date of Patent: May 8, 2012

(54) IMAGE SENSOR AND METHOD FOR MANUFACTURING THE SAME

(75) Inventors: Ki-Jun Yun, Suwon-si (KR); Sang-Wook Ryu, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 59 days.

(21) Appl. No.: 12/612,716

(22) Filed: Nov. 5, 2009

(65) Prior Publication Data
US 2010/0117173 A1    May 13, 2010

(30) Foreign Application Priority Data
Nov. 11, 2008    (KR) .................. 10-2008-0111420

(51) Int. Cl.
*H01L 31/02*    (2006.01)

(52) U.S. Cl. ............ 438/74; 438/44; 257/431; 257/414; 257/432; 257/433; 257/444; 257/290; 257/291; 257/292

(58) Field of Classification Search .................. 257/290, 257/291, 292, 294, 414, 431, 432, 433, 434, 257/444, 74; 438/48, 69, 74, 142, 197
See application file for complete search history.

(56) References Cited

U.S. PATENT DOCUMENTS

| | | | | |
|---|---|---|---|---|
| 7,883,920 B2* | 2/2011 | Hwang | ............................ | 438/57 |
| 2003/0113995 A1* | 6/2003 | Xia et al. | ....................... | 438/638 |
| 2008/0191296 A1* | 8/2008 | Wang et al. | .................... | 257/432 |
| 2009/0065829 A1* | 3/2009 | Kim | ............................ | 257/292 |

FOREIGN PATENT DOCUMENTS

| | | |
|---|---|---|
| KR | 10-0244711 B1 | 3/2000 |
| KR | 10-0860141 B1 | 9/2008 |

* cited by examiner

*Primary Examiner* — Ha Tran T Nguyen
*Assistant Examiner* — Suberr Chi
(74) *Attorney, Agent, or Firm* — Sherr & Vaughn, PLLC

(57) ABSTRACT

An image sensor and a method of manufacturing an image sensor. A method of manufacturing an image sensor may include forming an interconnection and/or an interlayer dielectric over a semiconductor substrate including circuitry connected to an interconnection. A method of manufacturing an image sensor may include forming a photodiode having a first doping layer and/or a second doping layer over an interlayer dielectric, and forming a via hole through a photodiode, which may expose a portion of a surface of an interconnection. A method of manufacturing an image sensor may include forming a barrier pattern over a via hole which may cover an exposed surface of a second doping layer, and a contact plug on and/or over a via hole, which may connect an interconnection and a first doping layer. An upper portion of a contact plug may be etched. An insulating layer may be formed over a contact plug.

14 Claims, 4 Drawing Sheets

IMAGE SENSOR AND METHOD FOR MANUFACTURING THE SAME

Figure 1:
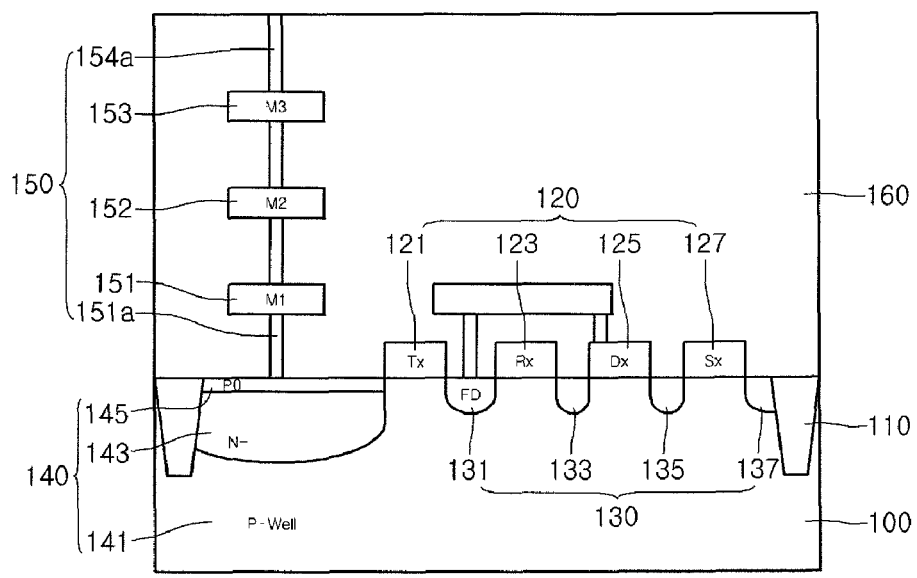

The present application claims priority under 35 U.S.C. 119 to Korean Patent Application No. 10-2008-0111420 (filed on Nov. 11, 2008) which is hereby incorporated by reference in its entirety.

BACKGROUND

Embodiments relate to an image sensor and a method of manufacturing an image sensor.

CMOS image sensors may have a structure in which photodiodes and transistors are horizontally disposed. While drawbacks of CCD image sensors may be addressed by related horizontal type CMOS image sensors, related horizontal type CMOS image sensors may have limitations. Photodiodes and transistors may be horizontally disposed adjacent to each other on and/or over a substrate. Accordingly, an additional region may be required for a photodiode, and thus there may be a limitations including relative reduction of a fill factor region and/or relative restriction of resolution.

It may also be relatively difficult to achieve optimization in reference to a process of manufacturing a photodiode and a transistor simultaneously. In a relatively quick transistor process, a shallow junction may be required for a low sheet resistance, but a shallow junction may not be appropriate for a photodiode. As additional on-chip functions are added to a horizontal type CMOS image sensor, the relative size of a unit pixel may need to relatively increased to maintain sensitivity of an image sensor, and/or may need to be relatively reduced to maintain an area of a photodiode to be a pixel size. If a pixel size increases, a resolution of an image sensor may be minimized, and if an area of a photodiode is relatively reduced, the relative sensitivity of an image sensor is minimized.

Accordingly, there is a need for an image sensor, and a method of manufacturing an image sensor, which may substantially relatively reduce an optical path, enhance photosensitivity, maximize resolution and/or maximize sensitivity.

SUMMARY

Embodiments relate to an image sensor and a method of manufacturing an image sensor. According to embodiments, a new integration of a circuitry and a photodiode may be provided. In embodiments, a method of manufacturing an image sensor may three-dimensionally integrate an image chip and a logic chip using one pad. In embodiments, an image chip may form a color filter array and/or a microlens after forming of a photodiode using two chips. In embodiments, a logic chip may include a driver IC which may drive an image chip and/or a logic array which may be capable of providing additional functions.

According to embodiments, a method of manufacturing an image sensor may substantially, and/or significantly, minimize an optical path. In embodiments, photosensitivity of an image sensor may be maximized. In embodiments, a plurality of metal lines may be substantially omitted at an upper part of a photodiode, which may relatively reduce a distance between a photodiode and a microlens. In embodiments, an image sensor may be provided including maximized resolution and/or sensitivity.

According to embodiments, a method of manufacturing an image sensor may regulate the size of an upper part of a metal interconnection formed on and/or over a contact hole of a photodiode. In embodiments, an amount of incident light to a photodiode may be maximized.

According to embodiments, a method of manufacturing an image sensor may include forming an interconnection and/or an interlayer dielectric on and/or over a semiconductor substrate where a circuitry may be formed. In embodiments, an interconnection may be connected to circuitry. In embodiments, a method of manufacturing an image sensor may include forming a photodiode on and/or over an interlayer dielectric. In embodiments, a photodiode may include a first doping layer and/or a second doping layer.

According to embodiments, a method of manufacturing an image sensor may include forming a via hole through a photodiode, and a via hole may expose a portion of a surface of an interconnection. In embodiments, a method of manufacturing an image sensor may include forming a barrier pattern on and/or over a via hole. In embodiments, a barrier pattern may cover an exposed surface of a second doping layer. In embodiments, a method of manufacturing an image sensor may include forming a contact plug on and/or over a via hole. In embodiments, a contact plug may connect a interconnection and a first doping layer. In embodiments, a method of manufacturing an image sensor may include etching an upper portion of a contact plug. In embodiments, a method of manufacturing an image sensor may include forming an insulating layer over a contact plug.

Embodiments relate to a method of manufacturing an image sensor. According to embodiments, a method of manufacturing an image sensor may include forming a photodiode on and/or over an interlayer dielectric which may include a metal interconnection. In embodiments, a method of manufacturing an image sensor may include forming a hard mask on and/or over a photodiode and performing a first etching process to etch a portion of a hard mask and/or a photodiode. In embodiments, a method of manufacturing an image sensor may include forming a barrier pattern which may insulate a portion of an exposed surface of a photodiode after a first etching process.

According to embodiments, a method of manufacturing an image sensor may include performing a second etching process of etching a photodiode and/or a interlayer dielectric which may form a via hole exposing a portion of a surface of a metal interconnection. In embodiments, a method of manufacturing an image sensor may include forming a contact plug at an opening of a hard mask, for example formed through a first etching process, and/or on and/or over a via hole formed for example through a second etching process. In embodiments, a method of manufacturing an image sensor may include etching an upper portion of a contact plug. In embodiments, a method of manufacturing an image sensor may include forming another metal interconnection and/or interlayer dielectric on and/or over a contact plug and/or a hard mask.

DRAWINGS

Example FIG. 1 to FIG. 6 are cross-sectional views illustrating a method of manufacturing an image sensor in accordance with embodiments.

Figure 7:
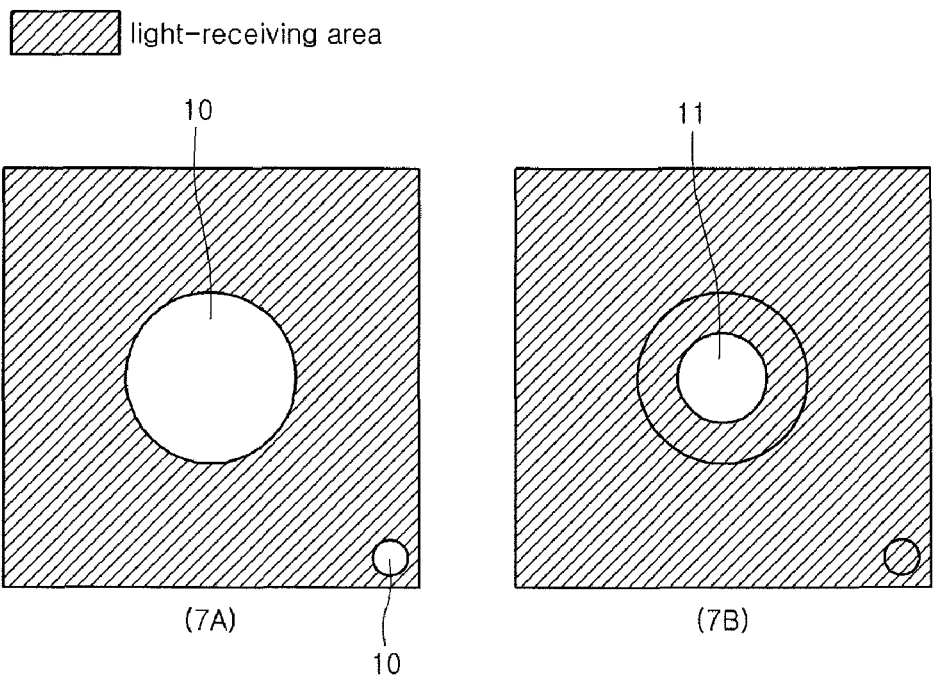

Example FIG. 7 is a plan view comparing light-receiving regions when a contact plug is formed on and/or over a photodiode region.

Figure 8:
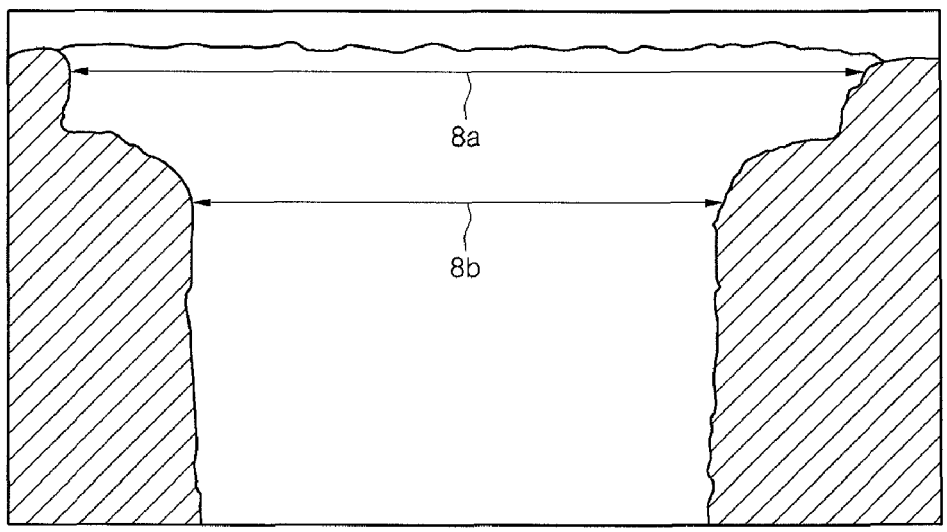

Example FIG. 8 is a cross-sectional view illustrating a formed contact plug after a hard mask is over-etched.

DESCRIPTION

Embodiments relate to a method of manufacturing an image sensor. Referring to example FIG. 1 to FIG. 6, cross-sectional views illustrate a method of manufacturing an image in accordance with embodiments. Referring to FIG. 1, a semiconductor substrate 100 may be prepared including interconnection 150 and circuitry 120. According to embodiments, device isolation layer 110 may be formed on and/or over second conductive type semiconductor substrate 100 to define an active region. In embodiments, circuitry 120 may be formed on and/or over an active region, and/or may include transistors.

Figure 2:
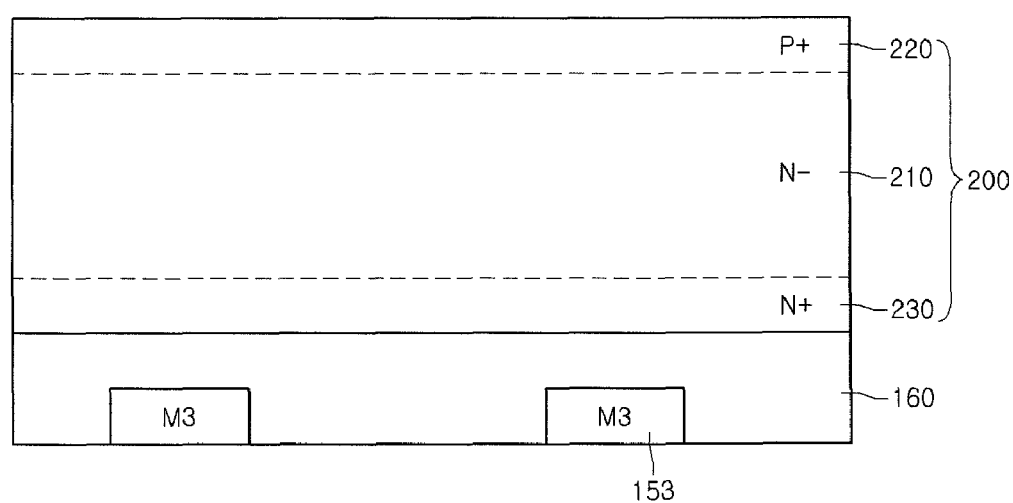

According to embodiments, circuitry 120 may include transfer transistor (Tx) 121, reset transistor (Rx) 123, drive transistor (Dx) 125 and/or select transistor (Sx) 127. In embodiments, ion implantation region 130 may be formed, and may include floating diffusion region (FD) 131 and source/drain regions 133, 135 and/or 137 for each transistor. In embodiments, electrical junction region 140 may include second conductive type ion implantation layer 143 formed on and/or over first conductive type well 141 and/or a first conductive type epitaxial layer. In embodiments, electrical junction region 140 may include first conductive type ion implantation layer 145 formed on and/or over second conductive type ion implantation layer 143. In embodiments, electrical junction region 140 may be formed of an P-N junction, as illustrated in FIG. 2, and/or a P0(145)/N−(143)/P−(141) junction, but embodiments are not limited thereto.

According to embodiments, P0/N−/P− junction 140 serving as a photodiode in a 4T CIS structure may be formed on and/or over semiconductor substrate 100. Unlike a node of floating diffusion (FD) 131, which may be an N+ junction, P/N−/P− junction 140 to which an applied voltage is not substantially fully transferred, may be pinched-off at a predetermined voltage. The voltage may relate to a pinning voltage, which may depend on doping concentrations of P0 145 and/or N− 143. Electrons generated from photodiode 210 may move to P0/N−/P− junction 140, and may be transferred to a node of floating diffusion (FD) 131 and/or converted into a voltage when transfer transistor (Tx) 121 is turned on.

According to embodiments, since a maximum voltage value of P0/N−/P− junction 140 may include a pinning voltage, and/or a maximum voltage value of a node of floating diffusion (FD) 131 may include a threshold voltage Vth of Vdd-Rx 123, electrons generated from photodiode 210 in an upper portion of a chip may be substantially fully dumped to a node of floating diffusion (FD) 131 by a potential difference between both ends of transfer transistor (Tx) 131 substantially without charge sharing. Accordingly, unlike a case where a photodiode is merely connected to a N+ junction, limitations such as saturation signal reduction and/or sensitivity reduction may be minimized.

According to embodiments, an interlayer dielectric and/or interconnection 150 may be formed on and/or over semiconductor substrate 100. In embodiments, interconnection 150 may include first metal contact 151a, first metal 151, second metal 152, third metal 153 and/or fourth metal contact 154a, but embodiments are not limited thereto.

Referring to FIG. 2, a photodiode 200 may be formed on and/or over interlayer dielectric 160 of semiconductor substrate 100. In embodiments, photodiode 200 may include a photodiode structure of a P-N junction including first doping layer (N−) 210 and/or second doping layer (P+) 220. In embodiments, ohmic contact layer (N+) 230, for example a third doping layer, may be formed under first doping layer 210. As illustrated, third metal 153 of interconnection 150 and/or interlayer dielectric 160 illustrated in FIG. 2 may represent a portion of interconnection 150 and/or interlayer dielectric 160 illustrated in FIG. 1, and portions of circuitry 120 and/or interconnection 150 may be omitted for convenience of explanation.

According to embodiments, photodiode 200 may be formed in a stacked structure including first doping layer 210 and/or second doping layer 220, for example by sequentially ion-implanting N-type impurities (N−) and/or P-type impurities (P+) on and/or over a P-type carrier substrate of a crystalline structure. In embodiments, relatively high-concentration N-type impurities (N+) may be ion-implanted under first doping layer 210 to form ohmic contact layer 230. In embodiments, ohmic contact layer 230 may minimize a contact resistance between the photodiode 200 and interconnection 150. In embodiments, first doping layer 210 may be formed to have a broader region than that of second doping layer 220. In embodiments, a depletion region may be relatively expanded to maximize generation of photoelectrons.

According to embodiments, a bonding process may be performed after ohmic contact layer 230 of a carrier substrate may be positioned on and/or over interlayer dielectric 160 to couple semiconductor substrate 100 with a carrier substrate. In embodiments, a surface of second doping layer 220 may be exposed by removing a carrier substrate including a hydrogen layer formed thereover through a cleaving process, to expose photodiode 200 bonded on and/or over interlayer dielectric 160. In embodiments, photodiode 220 may be formed on and/or over circuitry 120, which may relatively increase a fill factor and/or substantially prevent a defect of photodiode 200. In embodiments, since photodiode 200 may be bonded on and/or over interlayer dielectric 160 having a substantially uniform surface profile, bonding strength may be physically maximized.

Figure 3:
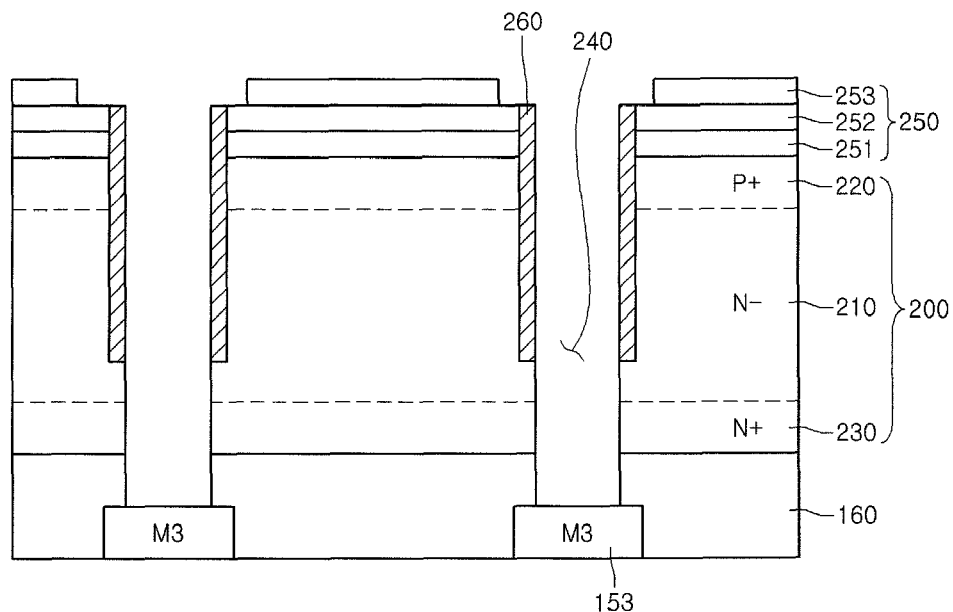

Referring to FIG. 3, a via hole 240 may be formed through photodiode 200 and/or interlayer dielectric 160. According to embodiments, via hole 240 may be a relatively deep via hole, and may expose a surface of third metal 153. In embodiments, barrier pattern 260 may be formed on and/or over a sidewall of via hole 240 corresponding to a portion of first doping layer 210 and/or second doping layer 220 of photodiode 200. In embodiments, barrier pattern 260 may be formed of an oxide and/or a nitride. In embodiments, second doping layer 220 on and/or over a sidewall of via hole 240 may be substantially fully covered by barrier pattern 260. In embodiments, first doping layer 210 adjacent to second doping layer 220 may be partially covered by barrier pattern 260. In embodiments, another portion of first doping layer 210 and/or ohmic contact layer 230 may be exposed by via hole 240.

Figure 4:
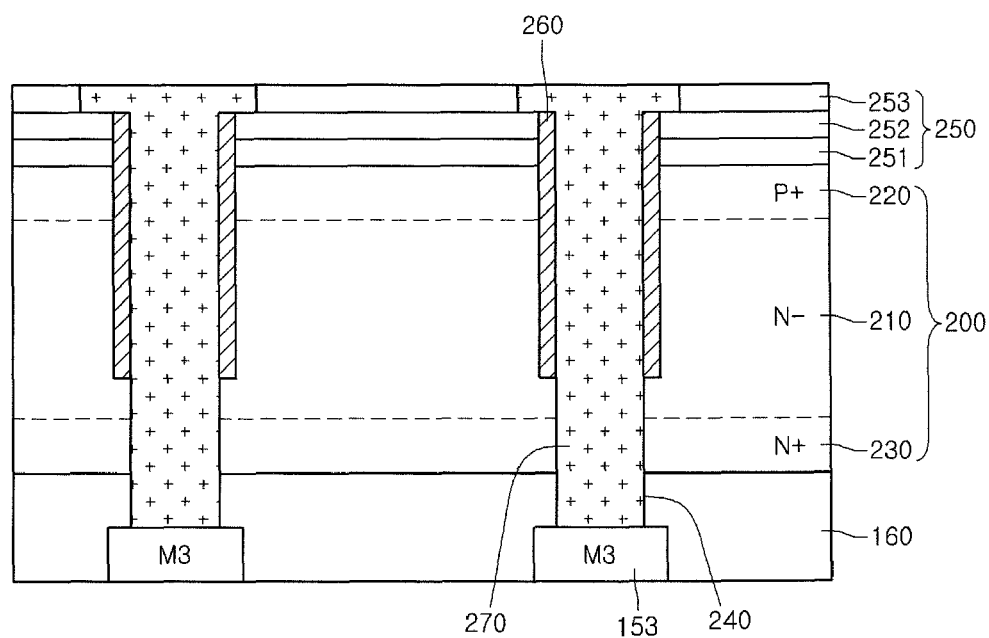

According to embodiments, barrier pattern 260 may substantially prevent second doping layer 220 from contacting a contact plug, as illustrated in FIG. 4, formed on and/or over via hole 240. In embodiments, barrier pattern 260 may allow electrons generated in photodiode 200 to be electrically moved along third doping layer 230 and/or a contact plug. In embodiments, barrier pattern 260 may substantially prevent second doping layer 220, forming an upper part of the photodiode 200, from being electrically connected to a contact plug. In embodiments, barrier pattern 260 may allows third doping layer 230, forming a lower part of the photodiode 200, to contact a contact plug. Barrier pattern 260 may be formed as illustrated in FIG. 3.

According to embodiments, a method for forming via hole 240 and/or a barrier pattern 260 may include forming hard mask pattern 250 for each unit pixel on and/or over photodiode 200. In embodiments, a portion of photodiode 200 may be etched using hard mask 250 as an etch mask, forming a via hole on and/or over a region over third metal 153. In embodiments, a via hole may partially expose second doping layer 220 and/or first doping layer 210 on and/or over third metal 153. A barrier layer may be formed on and/or over a via hole in accordance with embodiments. In embodiments, an etching process may be performed to remove a barrier layer from a bottom surface of a via hole, allowing barrier pattern 260 to remain on and/or over a sidewall of a via hole.

According to embodiments, an etching process using hard mask 250 and/or barrier pattern 260 as an etch mask may be performed to form via hole 240, which may penetrate photodiode 200 and/or interlayer dielectric 160. In embodiments, via hole 240 may expose a portion of an upper surface of third metal 153. In embodiments, hard mask 250 may be formed of an ONO layer in which an oxide and a nitride may be alternately stacked. In embodiments, an ONO layer may include first oxide 251, nitride 252 and/or a second oxide 253.

According to embodiments, in an etching processes to form via hole 240, substantially all of hard mask 250, photodiode 200 and/or interlayer dielectric 160 may not have a uniform profile due to the nature of the etching process. As illustrated, an opening of a hard mask may be formed greater than a via hole formed on and/or over photodiode 200 according to a difference of an etch selectivity in an etching process.

Referring to FIG. 4, contact plug 270 may be formed, which may electrically connect photodiode 200 and/or circuitry 120. According to embodiments, contact plug 270 may include metal material such as Cu, Al, Ti, Ta, Ti,TiN and/or W. In embodiments, contact plug 270 may be formed by gap-filling metal material on and/or over an opening of a hard mask and/or via hole 240. In embodiments, a planarization process may be performed. In embodiments, contact plug 270 on and/or over via hole 240 may be electrically connected to third metal 153 through photodiode 200 and/or interlayer dielectric 160.

According to embodiments, barrier pattern 260 may be partially formed on and/or over a sidewall of a contact plug to electrically separate contact plug 270 from second doping layer 220. In embodiments, photocharges generated in photodiode 200 may be delivered to circuitry 120 via a contact plug. In embodiments, since barrier pattern 260 may electrically separate contact plug 270 from second doping layer 220, photodiode 200 may operate relatively normally.

Figure 5:
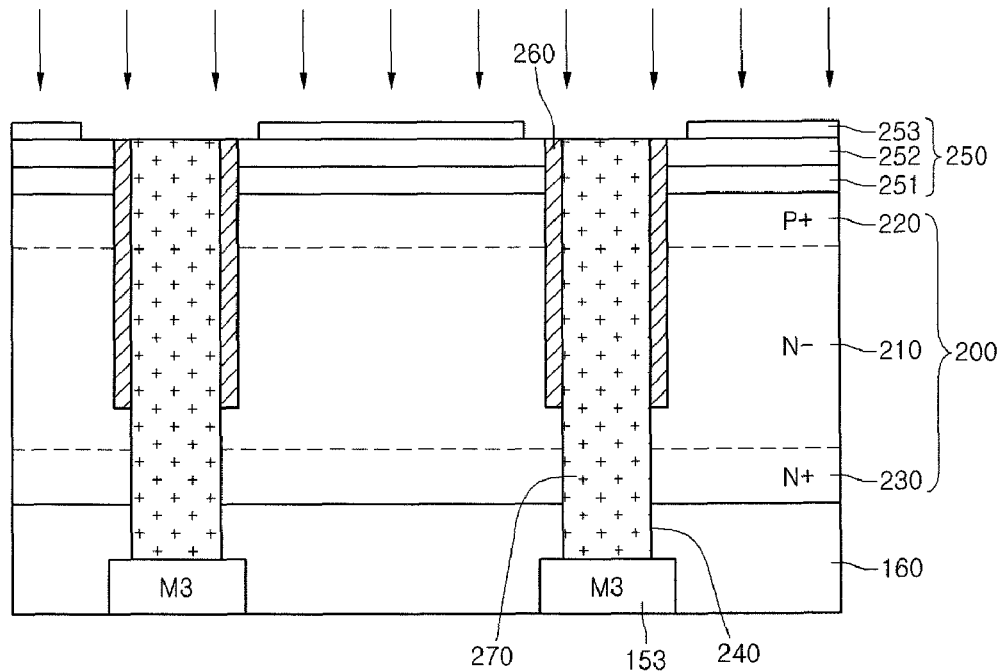

Referring to FIG. 5, an etch-back process may be performed to etch a portion of an upper part of contact plug 270. According to embodiments, a process etching a portion of a contact plug on and/or over hard mask 250 may be performed. As illustrated in FIG. 4, when the size of contact plug 270 at an opening of hard mask 250 may be different than that of contact plug 270 on and/or over via hole 240, the following may occur. If an ONO layer is used as a hard mask, second oxide 253 forming an upper layer of an ONO layer may be over-etched. When contact plug 270 is formed such that an opening of second oxide 253 on and/or over photodiode 200 is greater than that of a via hole, a sectional shape thereof may result as illustrated in example FIG. 8.

Referring to FIG. 8, a cross-sectional view illustrates a result of forming a contact plug after second oxide 253 of an ONO layer may be over-etched. Contact plug 270 may be formed such that a portion of an ONO layer may be used as a hard mask. As illustrated, a size 8a of a contact plug on and/or over an opening of a second oxide layer may be formed greater than a size 8b of a contact plug on and/or over a via hole of a photodiode. When contact plug 270 is formed to have a greater size at an upper part thereof, there is a possibility that an amount of light which photodiode 200 receives may be minimized. When attempting to minimize a size of a contact plug to miniaturize a semiconductor device, a greater size of a contact plug positioned on and/or over a photodiode region may cause light-receiving efficiency to be minimized.

Referring to example FIG. 7, a plan view illustrates a comparison of a contact plug formed on and/or over a photodiode region. Referring to FIG. 7A, an upper part of a contact plug may be formed to have a greater size due to an over-etch of a hard mask, for example by an etch selectivity difference upon forming via hole 240 on and/or over a photodiode region. Referring to FIG. 7B, a portion of an upper part of a contact plug may be etched in accordance with embodiments. A comparison between both light-receiving areas illustrate a relative reduction of a size of an upper part of a contact plug.

Referring back to FIG. 5, and in accordance with embodiments, contact plug 270 may be formed on and/or over via hole 240. In embodiments, an etch-back process may be performed on and/or over a surface of a substrate, which may be substantially the entire surface of substrate 100, to remove a portion of an upper part of a contact plug formed on and/or over a hard mask. In embodiments, second oxide 253 may be used as a hard mask, and may be partially etched to be reduced in thickness. In embodiments, contact plug 270 may have a substantially uniform profile.

Figure 6:
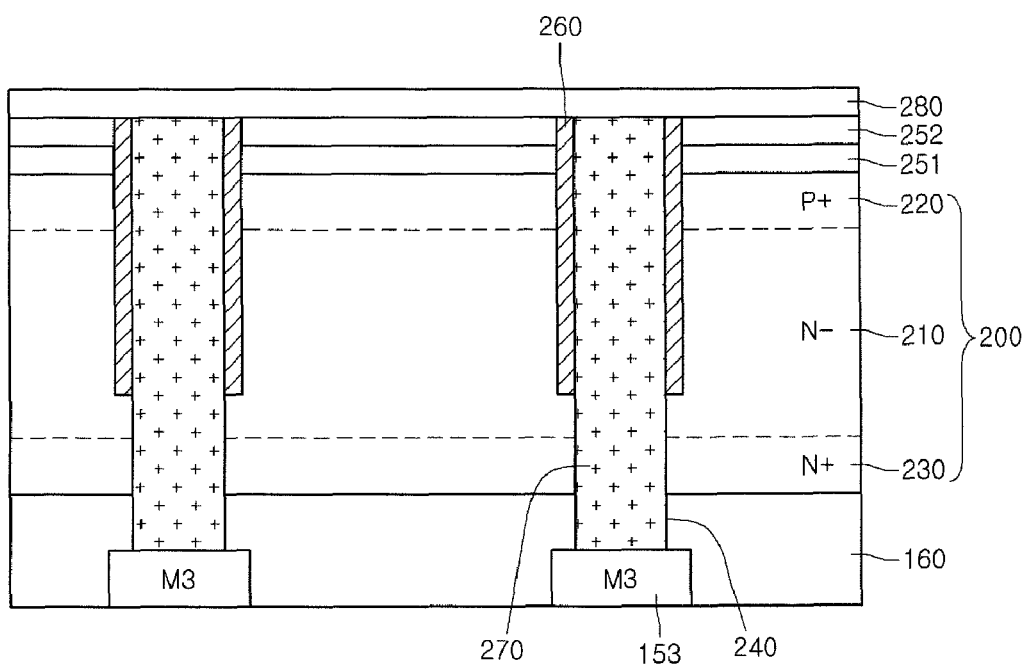

Referring to FIG. 6, an oxide 280 may be deposited on and/or over photodiode 200 and/or hard mask 250. According to embodiments, oxide 280 may be formed on and/or over contact plug 270 and/or hard mask 250. In embodiments, oxide 280 may be formed of substantially the same material as second oxide 253 which may have been used as a hard mask. In embodiments, if second oxide 253 of a hard mask is formed of tetra-ethyl-ortho-silicate (TEOS), oxide 280 may also be formed of TEOS. In embodiments, forming oxide 280 on and/or over contact plug 270 and/or hard mask 250 may enable a process of forming a color filter and/or a microlens, as a subsequent process, to be relatively smoothly performed.

According to embodiments, an insulating layer may be formed on and/or over oxide layer 280 and/or contact plug 270. In embodiments, a second via hole may be formed on and/or over an insulating layer and/or oxide 280. In embodiments, a second contact plug may be formed on and/or over a second via hole, and may be electrically connected to second doping layer 220 of photodiode 200. In embodiments, a reverse bias may be applied to a photodiode. In embodiments, a metal interconnection may be formed which may electrically connect to a second contact plug. In embodiments, a color filter and/or a microlens may be formed on and/or over photodiode 200.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming an interconnection and an interlayer dielectric over a semiconductor substrate including a circuitry such that said interconnection is connected to said circuitry;
   forming a photodiode over said interlayer dielectric including a first doping layer and a second doping layer;
   forming a via hole through the photodiode exposing a portion of a surface of the interconnection;
   forming a barrier pattern over said via hole covering an exposed surface of said second doping layer;
   forming a contact plug over said via hole connecting the interconnection and said first doping layer;
   etching an upper portion of said contact plug; and
   forming an insulating layer over said contact plug.

2. The method of claim 1, wherein etching said upper portion of said contact plug comprises performing an etch-back process over a surface of said semiconductor substrate to expose an upper surface of the barrier pattern.

3. The method of claim 2, wherein said etch-back process is performed over substantially an entire surface of said semiconductor substrate.

4. The method of claim 1, wherein forming said via hole comprises forming a hard mask over the photodiode and etching the photodiode using said hard mask to expose said second doping layer.

5. The method of claim 4, wherein said hard mask is formed comprising at least one of an oxide and a nitride.

6. The method of claim 4, wherein etching said upper portion of said contact plug comprises etching a portion of said contact plug positioned at an opening of said hard mask, and wherein the etched portion of said contact plug has a greater diameter than a diameter of the via hole of the photodiode.

7. The method of claim 1, wherein the barrier pattern fully covers the second doping layer over a sidewall of the via hole, and partially covers the first doping layer adjacent to the second doping layer, and exposes a portion of the first doping layer.

8. The method of claim 1, comprising depositing an oxide over said contact plug after etching said upper portion of said contact plug.

9. The method of claim 8, wherein said oxide over said contact plug comprises substantially a same material as a hard mask used in an etching process to form said via hole over said photodiode.

10. The method of claim 1, wherein etching said upper portion of said contact plug provides a substantially uniform contact plug profile.

11. A method comprising:
forming a photodiode over an interlayer dielectric having a metal interconnection;
forming a hard mask over the photodiode and performing a first etching process to etch a portion of said hard mask and said photodiode;
forming a barrier pattern to insulate a portion of an exposed surface of the photodiode after said first etching process;
performing a second etching process to etch the photodiode and said interlayer dielectric to form a via hole exposing a portion of a surface of said metal interconnection;
forming a contact plug at an opening of said hard mask, formed through said first etching process, and over said via hole, formed through said second etching process;
etching an upper portion of said contact plug; and
forming another at least one of a metal interconnection and an interlayer dielectric over said contact plug and said hard mask.

12. The method of claim 11, wherein etching of said upper portion of said contact plug comprises removing a portion of said contact plug formed at said opening of said hard mask through an etch-back process.

13. The method of claim 12, wherein removing said portion of said contact plug formed at said opening of said hard mask provides a substantially uniform contact plug profile.

14. The method of claim 11, wherein said hard mask comprises a stacked structure including at least one of a nitride and an oxide, such that an upper portion of said contact plug is formed over an upper surface of at least one of the nitride and the oxide.

\* \* \* \* \*